(12) United States Patent
Chen et al.

(10) Patent No.: US 12,062,746 B2
(45) Date of Patent: Aug. 13, 2024

(54) SMALL-SIZED VERTICAL LIGHT EMITTING DIODE CHIP WITH HIGH ENERGY EFFICIENCY

(71) Applicant: EXCELLENCE OPTO. INC., Miaoli County (TW)

(72) Inventors: Fu-Bang Chen, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 423 days.

(21) Appl. No.: 17/577,826

(22) Filed: Jan. 18, 2022

(65) Prior Publication Data

US 2023/0231092 A1    Jul. 20, 2023

(51) Int. Cl.
| | |
|---|---|
| *H01L 33/62* | (2010.01) |
| *H01L 33/00* | (2010.01) |
| *H01L 33/04* | (2010.01) |
| *H01L 33/10* | (2010.01) |

(52) U.S. Cl.
CPC .......... *H01L 33/62* (2013.01); *H01L 33/0016* (2013.01); *H01L 33/04* (2013.01); *H01L 33/10* (2013.01)

(58) Field of Classification Search
CPC ..... H01L 33/62; H01L 33/0016; H01L 33/04; H01L 33/10
USPC ........................................................ 257/79
See application file for complete search history.

(56) References Cited

U.S. PATENT DOCUMENTS

| | | | | |
|---|---|---|---|---|
| 2014/0151711 A1* | 6/2014 | Yen | .......................... | H01L 33/44 257/98 |
| 2016/0372627 A1* | 12/2016 | Sawano | .................. | H01L 33/38 |
| 2019/0164945 A1* | 5/2019 | Chae | ....................... | H01L 33/62 |

FOREIGN PATENT DOCUMENTS

| | | | | | |
|---|---|---|---|---|---|
| CN | 105826443 A | * | 8/2016 | ............. | H01L 33/38 |
| CN | 109216515 A | * | 1/2019 | ......... | H01L 33/0091 |

OTHER PUBLICATIONS

Yuewei Zhang et al., Recent progress of tunnel junction-based ultra-violet light emitting diodes, 2019, Jpn. J. Appl. Phys. 58 SC0805 (Year: 2019).*

(Continued)

*Primary Examiner* — Jami Valentine Miller
*Assistant Examiner* — Ashley Nicole Blackwell
(74) *Attorney, Agent, or Firm* — MUNCY, GEISSLER, OLDS & LOWE, P.C.

(57) ABSTRACT

The invention is a small-sized vertical light emitting diode chip with high energy efficiency, wherein a PN junction structure is arranged on a light-emitting region platform of an interface structure; a highly reflective metal layer is arranged under the light-emitting region platform; the interface structure is provided with a P-type ohmic contact area under an outwardly extending platform adjacent to the light-emitting region platform; an insulating layer is formed on the outwardly extending platform; an N-type ohmic contact electrode is in ohmic contact with the PN junction structure and covers the border covering region at a position opposite to the outwardly extending platform; the current conduction is achieved diagonally on the opposite sides by locally diagonally symmetric geometric positioning of the N-type ohmic contact electrode and the P-type ohmic contact area.

12 Claims, 11 Drawing Sheets

(56) References Cited

OTHER PUBLICATIONS

Kim, Jong Kyu, Omni-directional reflectors for light-emitting diodes, 2006, Proceedings vol. 6134, Light-Emitting Diodes: Research, Manufacturing, and Applications X; 61340D (2006) https://doi.org/10.1117/12.661563 (Year: 2006).*

* cited by examiner

SMALL-SIZED VERTICAL LIGHT EMITTING DIODE CHIP WITH HIGH ENERGY EFFICIENCY

FIELD OF THE INVENTION

The invention relates to a chip structure for light emitting diodes (LED), and more particularly, to a small-sized vertical light emitting diode chip with high energy efficiency.

BACKGROUND OF THE INVENTION

According to the appearance, electrode arrangement and direction of current in semiconductor layer, LED chips are mainly divided into three configurations: horizontal, vertical and flip-chip. The horizontal LED chip and the vertical LED chip with small size have relatively low energy efficiency. Thus, the conventional high-class fine-pitch LED displays are mainly flip-chip small-sized chips with better light efficiency, which are surface mounted diodes (SMD). There is no need to connect the electrode pads above a light-emitting surface by wire bonding; and the N electrode and the P electrode (P/N electrode) at the bottom of the flip-chip small-sized crystal chips are conductively connected with the encapsulation loading plate by the electrode pads, so that no electrode shields the light of the light-emitting surface above the chip and the chip at a small size has better light-emitting efficiency.

However, there are many disadvantages when both the N electrode and the P electrode is conductively adhered to the loading plate at the bottom of the small-sized chips. First, it is easily short-circuited as size of and distance between the electrode pads are too small. Second, the heat dissipation of the electrode pad of the small-sized chip is worse than that of the vertical LED, wherein the electrode pad of the vertical LED is on the whole surface of the bottom. Third, the reliability under the conditions of automobile use is in doubt. Finally, the process of phosphide red light emitting flip-chip LEDs is much more complicated than that of nitride blue-green light emitting ones; and the cost of the flip-chip LED grown by non-sapphire substrate is much higher than that of vertical LED. Therefore, the vertical LEDs have advantages in reliability for vehicles, but their energy efficiency is poor. If the light efficiency is improved, it is beneficial to the development of small-sized LED displays for vehicles that high reliability is in demand.

Figure 1:
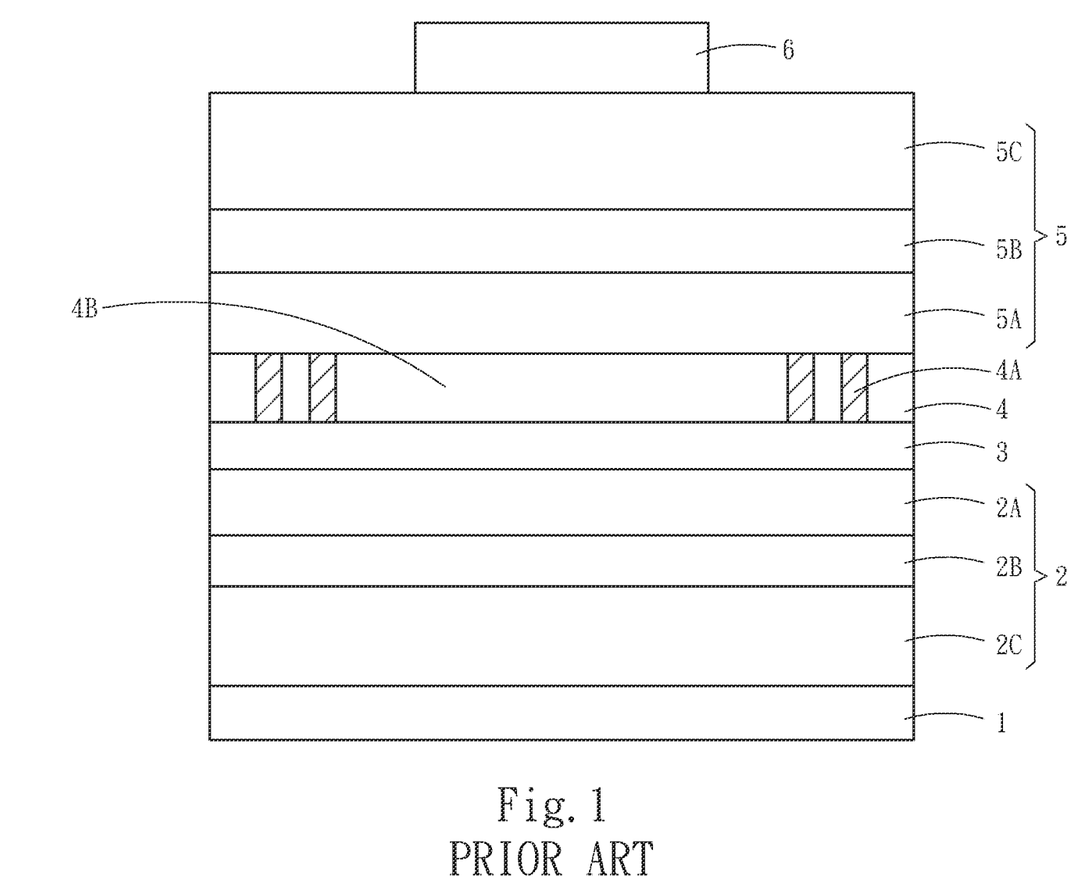
FIG. 1 is a cross-sectional side view of a conventional small-sized vertical LED structure.
Figure 2:
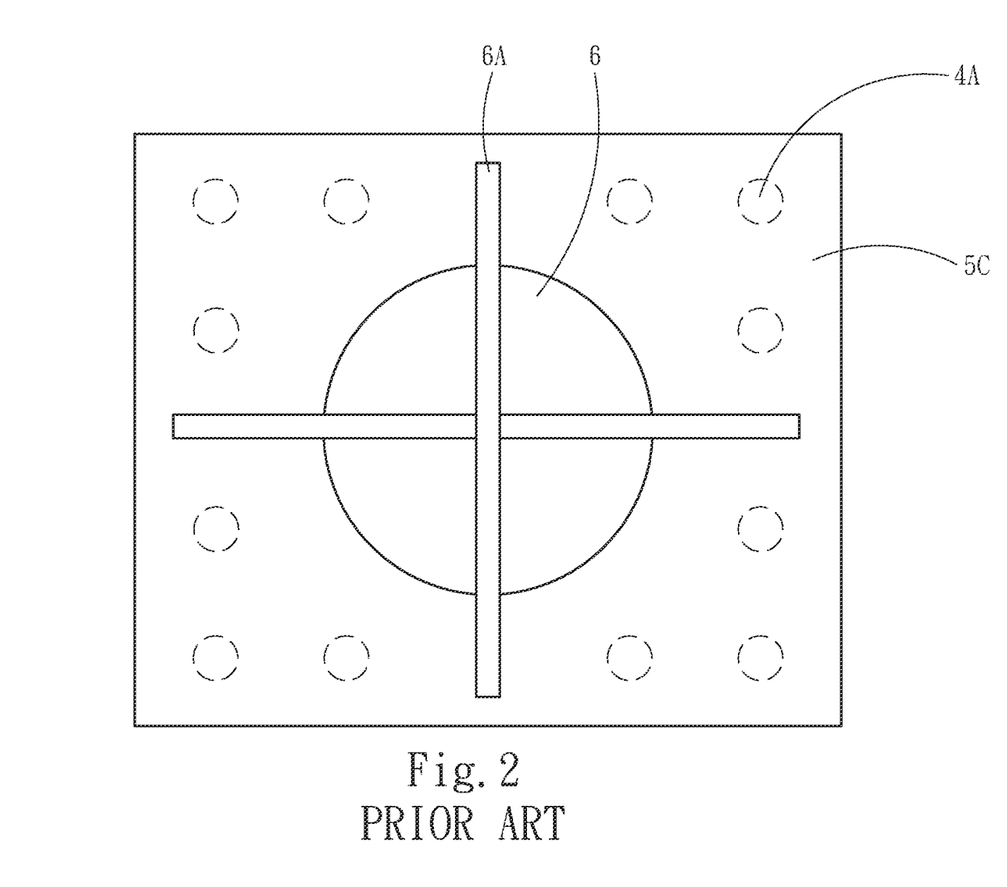
FIG. 2 is a top view of a conventional small-sized vertical LED.

A conventional vertical light emitting diode structure is shown in FIG. 1, including a P-type electrode 1, a chip conductive base structure 2, a reflective layer 3, an interface structure 4, a PN junction structure 5 and an N-type electrode pad 6, wherein the chip conductive base structure 2 comprises a structural metal layer 2A, an alternative substrate adhesive layer 2B and an alternative substrate 2C; and the interface structure 4 is a partial P-type ohmic contact metal layer, including a P-type ohmic contact area 4A and a non-ohmic contact area 4B. The PN junction structure 5 comprises a P-type semiconductor 5A, an active layer 5B and an N-type semiconductor 5C. The vertical LED has high axial light and good heat dissipation, which is beneficial to color rendering and high temperature operation. However, the length of a straight line side of a conventional small-sized vertical light emitting diode chip is about 200 micrometers (μm), which necessarily occupies a scale of about 40 μm due to the need for a light-absorbing interfering substance, such as a cutting channel, a side wall, a metal layer conducting layer at the edge of the chip. As shown in FIG. 2, since an N-type electrode pad 6 is provided in a central region on the N-type semiconductor 5C (light-emitting surface), the central light emission is shielded, and the N-type electrode pad 6 is located above the active layer 5B and the N-type semiconductor 5C. Since the areas of the chips and the electrode pads are very small, micro-cracks and defects of the active layer 5B are easily caused during wire bonding. In addition, a reference line 6A is generally provided as a finger to interdigitate above the N-type semiconductor 5C. The more the reference lines 6A are provided on the N-type semiconductor 5C, the better the current distribution is, but the light shielding area is also increased. Therefore, the light efficiency and reliability of the conventional small-sized vertical LEDs are inferior to those of the small-sized flip-chip LEDs. However, the high axial light and heat dissipation characteristics of the conventional small-sized vertical LEDs are more conducive to the use of high-contrast automotive fine-pitch displays.

SUMMARY OF THE INVENTION

The main object of the invention is to provide a small-sized vertical light emitting diode chip with high energy efficiency, which is free of shielding and light-absorbing substances on both an upper light-emitting surface and a lower reflecting surface, so that the requirement of high energy efficiency is achieved; and the wiring of the N electrode pad is not located on a plane above the semiconductor PN junction structure, so that the requirement of high reliability is achieved.

The invention is a small-sized vertical light emitting diode chip with high energy efficiency, comprising a P-type electrode, a chip conductive base structure, an interface structure, a PN junction structure, an insulating layer, a bridging connected metal layer, an N-type ohmic contact electrode and an N-type electrode pad. The P-type electrode is provided at a side of the chip conductive base structure; and the interface structure is provided at a side of the chip conductive base structure opposite to the P-type electrode. The interface structure comprises a highly conductive metal layer, a highly reflective metal layer, a partial P-type ohmic contact layer and a high-concentration P-type semiconductor layer stacked in sequence; the high-concentration P-type semiconductor layer is light-transmitting; and the interface structure comprises a light-emitting region platform and an outwardly extending platform adjacent to the light-emitting region platform.

The partial P-type ohmic contact layer comprises a P-type ohmic contact area and a non-ohmic contact area; the P-type ohmic contact area is located under the outwardly extending platform; the non-ohmic contact area is located under the light-emitting region platform; the P-type ohmic contact area is in ohmic contact with the high-concentration P-type semiconductor layer; and the non-ohmic contact area is in non-ohmic contact with the high-concentration P-type semiconductor layer.

The PN junction structure comprises a P-type semiconductor, an active layer and an N-type semiconductor stacked in sequence; the P-type semiconductor is arranged on the light-emitting region platform; the PN junction structure is a closed pattern comprising four straight sides, a ratio of a longest side to a shortest side of the PN junction structure is less than 3; and a light-emitting surface area of the PN junction structure is less than 0.06 square millimeters (mm$^2$). The insulating layer is formed on the outwardly extending platform; and the insulating layer extends to cover the four straight sides of the N-type semiconductor to form a border covering region surrounding the N-type semiconductor. The bridging connected metal layer is provided on the insulating layer and extends to the border covering region and the outwardly extending platform.

The N-type ohmic contact electrode reaches ohmic contact with the N-type semiconductor at a position opposite to the outwardly extending platform; the N-type ohmic contact electrode partially covers the border covering region; the N-type ohmic contact electrode extends to the border covering region and is electrically connected to the bridging connected metal layer; and the N-type electrode pad is formed on the bridging connected metal layer at a location corresponding to the outwardly extending platform to electrically connect the outwardly extending platform.

Accordingly, the current is diagonally conducted between the opposite sides by arranging the N-type ohmic contact electrode and the P-type ohmic contact area on opposite side regions in a locally obliquely symmetric ohmic contact region geometry, allowing a current to pass obliquely downward from the N-type ohmic contact electrode through the active layer in the PN junction structure; and both an upper light-emitting surface and a lower light-reflecting surface of the active layer in the PN junction structure are free of shielding and light-absorbing substances, resulting in high energy efficiency. In addition, the wire bonding of the N-type electrode pad is not on a plane above the PN junction structure, so that the requirement of high reliability is achieved.

DETAILED DESCRIPTION OF THE PREFERRED EMBODIMENTS

Figure 3:
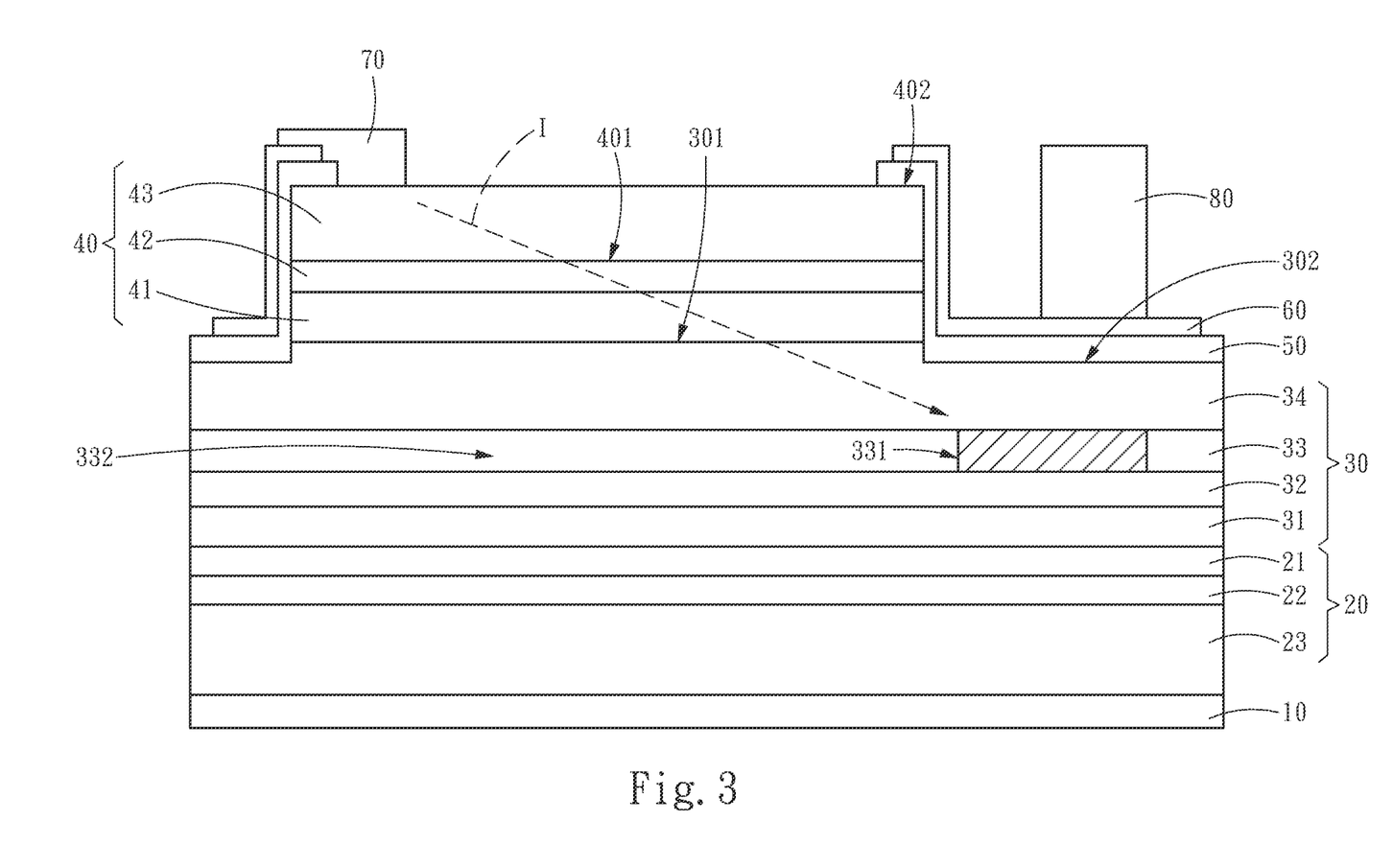
FIG. 3 is a cross-sectional side view of a chip structure according to a first embodiment of the invention.

Referring to FIG. 3, a first embodiment of the invention comprises a P-type electrode 10, a chip conductive base structure 20, an interface structure 30, a PN junction structure 40, an insulating layer 50, a bridging connected metal layer 60, an N-type ohmic contact electrode 70 and an N-type electrode pad 80. The P-type electrode 10 is provided at a side of the chip conductive base structure 20; and the interface structure 30 is provided at a side of the chip conductive base structure 20 opposite to the P-type electrode 10. The chip conductive base structure 20 comprises a structural metal layer 21, an alternative substrate adhesive layer 22, and an alternative substrate 23.

In an embodiment, the interface structure 30 comprises a highly conductive metal layer 31, a highly reflective metal layer 32, a partial P-type ohmic contact layer 33 and a high-concentration P-type semiconductor layer 34 stacked in sequence; the high-concentration P-type semiconductor layer 34 is light-transmitting; the interface structure 30 comprises a light-emitting region platform 301 (below the PN junction structure 40) and an outwardly extending platform 302 adjacent to the light-emitting region platform 301; the partial P-type ohmic contact layer 33 comprises a P-type ohmic contact area 331 and a non-ohmic contact area 332; and the P-type ohmic contact area 331 is located under the outwardly extending platform 302, the non-ohmic contact area 332 is located under the light-emitting region platform 301, and the non-P-type ohmic contact area 332 is adjacent to the P-type ohmic contact area 331. The P-type ohmic contact area 331 is in ohmic contact with the high-concentration P-type semiconductor layer 34 to facilitate current conduction downward; and the non-ohmic contact area 332 is in non-ohmic contact (in Schottky contact) with the high-concentration P-type semiconductor layer 34 to prevent downward conduction of current. The high-concentration P-type semiconductor layer 34 comprises a thickness of more than 1 μm to facilitate lateral conduction of P-type current.

The non-ohmic contact area 332 is made of any one selected from a transparent and light-transmitting dielectric material and a highly reflective metal material. When the non-ohmic contact area 332 is selected from the transparent and light-transmitting dielectric material, the non-ohmic contact area 332 is an Omni-directional reflector (ODR). The highly reflective metal material is selected from silver (Ag), aluminum (Al) or gold (Au). If the non-ohmic contact area 332 is a highly reflective metal material, the non-ohmic contact area 332 is necessary to be in non-ohmic contact with a high concentration P-type semiconductor to avoid the conduction of current downward directly from this region.

The PN junction structure 40 is arranged on the light-emitting region platform 301. In an embodiment, the PN junction structure 40 comprises a P-type semiconductor 41, an active layer 42 and an N-type semiconductor 43 stacked in sequence from bottom to top. The PN junction structure 40 is selected from a light emitting diode structure with a single PN junction or a tunnel junction light emitting diode structure with two PN junctions. Furthermore, the P-type semiconductor 41 is arranged on the light-emitting region platform 301; and a biggest thickness region of the N-type semiconductor 43 is greater than 2.5 μm to facilitate lateral current conduction of the N-type semiconductor 43. In addition, the PN junction structure 40 is a closed geometric pattern, and comprises a central region 401. When a light-emitting surface area of the PN junction structure 40 is less than 0.06 mm$^2$ and a biggest thickness region of the N-type semiconductor 43 is greater than 2.5 μm, uniformity of lateral current diffusion of the N-type semiconductor 43 is improved.

Figure 4A:
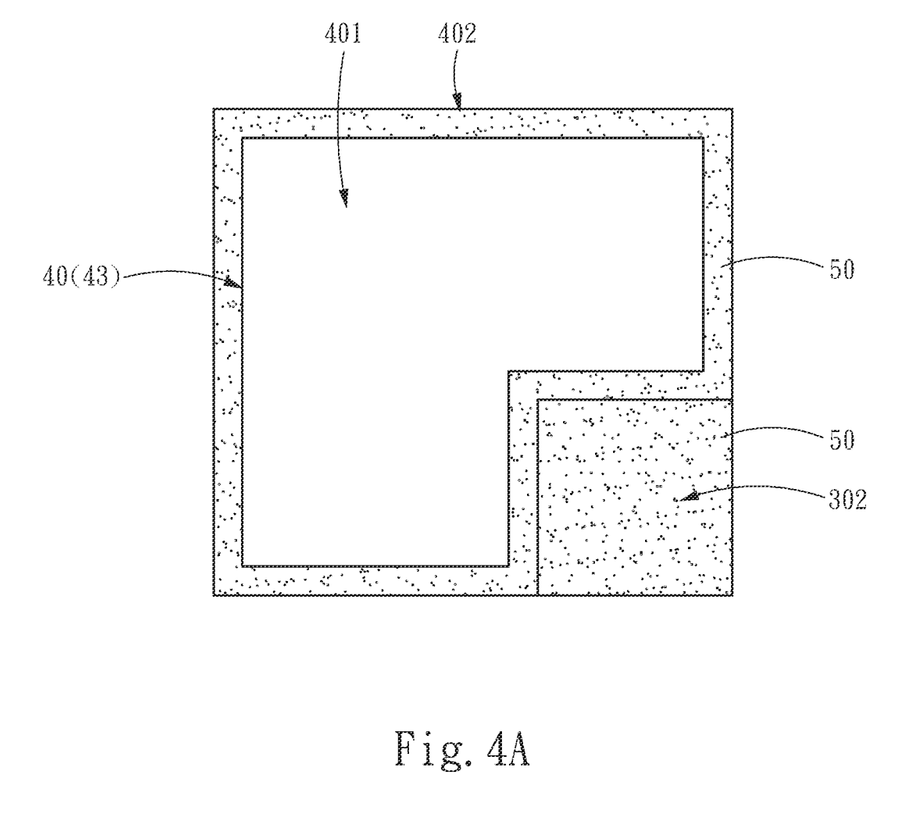
FIG. 4A is a first schematic top view of a chip structure according to a first embodiment of the invention.
Figure 4B:
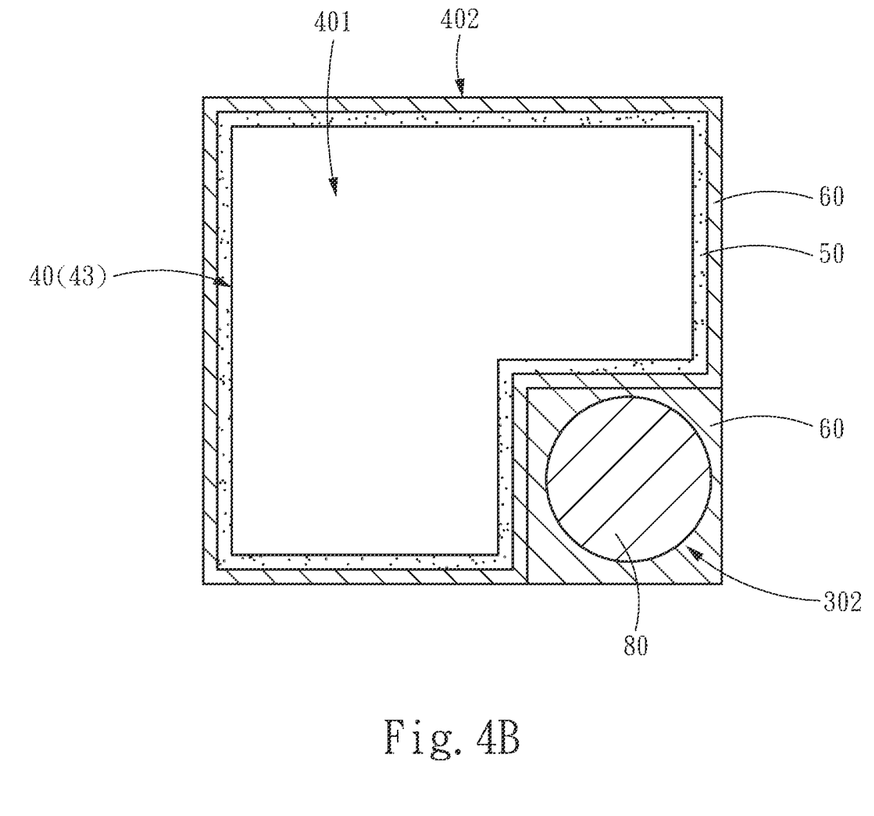
FIG. 4B is a second schematic top view of a chip structure according to a first embodiment of the invention.
Figure 4C:
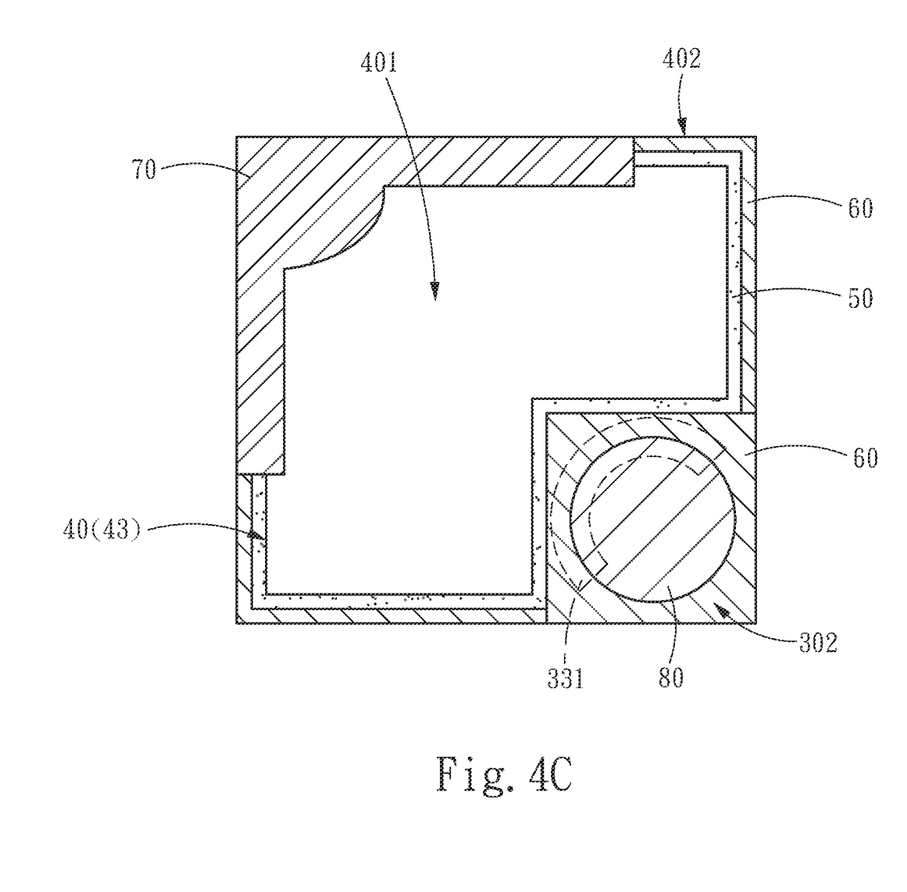
FIG. 4C is a third schematic top view of a chip structure according to a first embodiment of the invention.

Referring to FIG. 4A, FIG. 4B, and FIG. 4C, the insulating layer 50, the bridging connected metal layer 60, the N-type ohmic contact electrode 70, and the N-type electrode pad 80 are schematically depicted in an opaque fashion to clarify the relationship of layers. First, as shown in FIG. 4A, to deposit the insulating layer 50, the insulating layer 50 is formed on the outwardly extending platform 302; and the insulating layer 50 extends to cover the four straight sides of the PN junction structure 40 to form a border covering region 402 surrounding the PN junction structure 40. In one embodiment, the insulating layer 50 is a SiO$_2$ insulating material with a thickness greater than 500 nanometers (nm) applied by isotropic Plasma-Enhanced Chemical Vapor Deposition (PECVD), to provide better adhesion to sidewalls of the PN junction structure 40. In one embodiment, the insulating layer 50 is selected from TiO$_2$ or SiN.

Next, as shown in FIG. 4B, in order to provide the bridging connected metal layer 60 and form the N-type electrode pad 80 thereon, the bridging connected metal layer 60 is provided on the insulating layer 50 and extends to the border covering region 402 and the outwardly extending platform 302. The N-type electrode pad 80 is formed on the bridging connected metal layer 60 at a location corresponding to the outwardly extending platform 302 to electrically connect the bridging connected metal layer 60. The N-type electrode pad 80 is provided in a circular shape on the outwardly extending platform 302; and an about 3 μm thickness of gold (Au) is deposited over the N-type electrode pad 80 for subsequent package and wire bonding.

Next, as shown in FIG. 4C, it a schematic top view of a chip structure according to a first embodiment of the invention. In order to provide the N-type ohmic contact electrode 70, the N-type ohmic contact electrode 70 reaches ohmic contact with the N-type semiconductor 43 (the PN junction structure 40) at a position opposite to the outwardly extending platform 302; the N-type ohmic contact electrode 70 partially covers the border covering region 402; and the N-type ohmic contact electrode 70 extends to the border covering region 402 and is electrically connected to the bridging connected metal layer 60.

In another embodiment, the P-type ohmic contact area 331 is a continuous monolithic single region, preferably a continuous arc area (as shown in FIG. 4C). The N-type ohmic contact electrode 70 is also a continuous monolithic single region provided at the corners to facilitate current spreading. The P-type ohmic contact area 331 is arranged under the outwardly extending platform 302.

In FIG. 4C, the position of the P-type ohmic contact area 331 shows the relative position of the N-type ohmic contact electrode 70 and the P-type ohmic contact area 331. Accordingly, as shown in FIG. 3, a current I is introduced by the N-type electrode pad 80. By the relative position of the N-type ohmic contact electrode 70 and the P-type ohmic contact area 331, the current I is generated obliquely downward through the central region 401 of the PN junction structure 40 from the N-type ohmic contact electrode 70.

Figure 5:
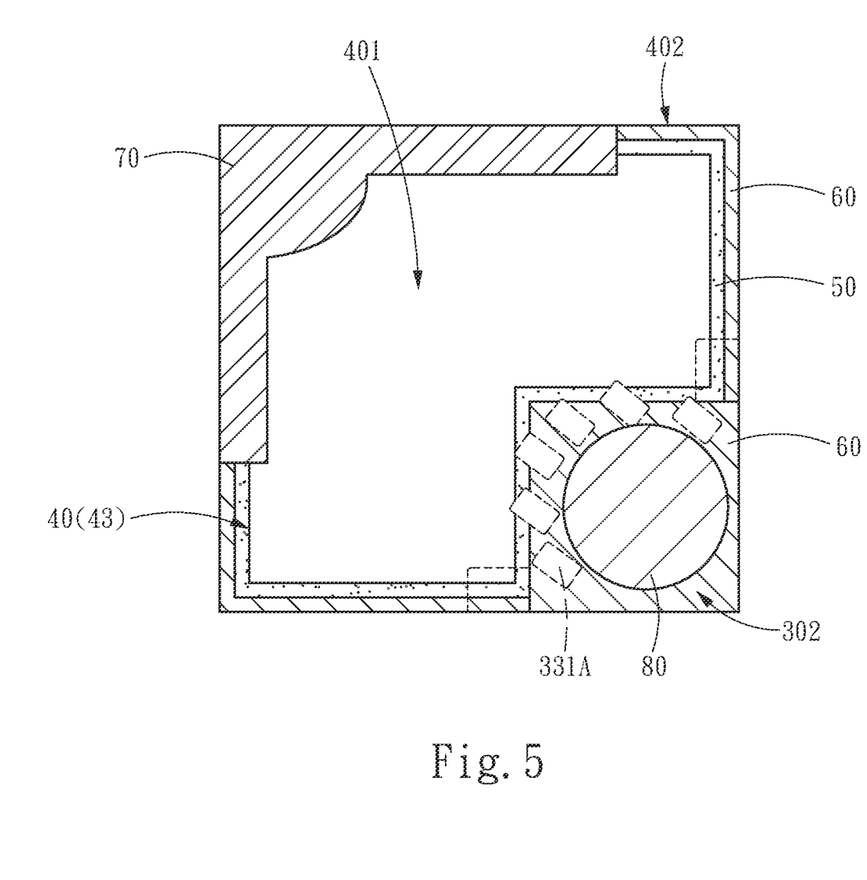
FIG. 5 is a schematic top view of a chip structure according to a second embodiment of the invention.

Referring to FIG. 5, for a second embodiment of the invention, the P-type ohmic contact area 331A is a plurality of non-continuous regions, such as a plurality of pillars. In one embodiment, the plurality of pillars are BeAu pillars in AlGaInP LEDs contacting p-GaP ohmic. A highly conductive metal layer 31 (see FIG. 3) is formed in a chemically stable highly-conductive metal (such as Silver, Gold, Aluminum, Titanium, Titanium Tungsten, or Platinum) to achieve high lateral current conduction. The high-concentration P-type semiconductor layer 34 is any one selected from P-type gallium phosphide (p-GaP) or P-type indium gallium phosphide (p-Ga$_{(x)}$In$_{(1-x)}$P); and a high-concentration doping is any one selected from carbon (C) or magnesium (Mg).

Figure 6:
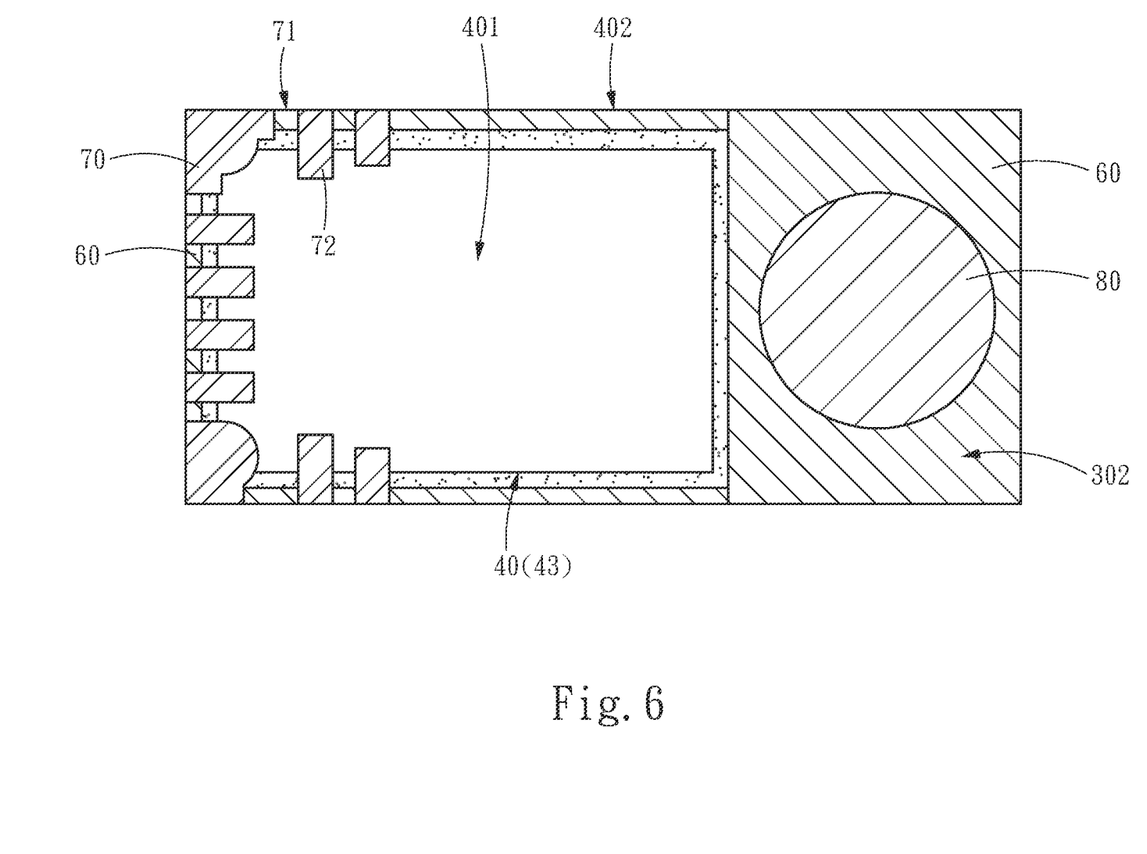
FIG. 6 is a schematic top view of a chip structure according to a third embodiment of the invention.

Referring to FIG. 6, it is a top view of the chip structure according to a third embodiment of the invention. The PN junction structure 40 is a rectangular shape, a ratio of a longest side to a shortest side of the PN junction structure 40 is less than 3, wherein an optimal current conduction occurs when the ratio is close to 1; the ratio greater than 1 and less than 3 is advantageous for the arrangement of a plurality of chip in a same encapsulation. The N-type ohmic contact electrode 70 comprises at least one extension electrode 72 extending into the central region 401 and being a non-continuous area, to help adjust the distribution of the current I; and the N-type ohmic contact electrode 70 comprises at least one exposing opening 71 extending to a boundary of the PN junction structure 40.

The N-type ohmic contact electrode 70 reaches ohmic contact with the N-type semiconductor 43 (the PN junction structure 40) at a position opposite to the outwardly extending platform 302; and the N-type ohmic contact electrode 70 partially covers the border covering region 402, provided that the N-type ohmic contact electrode 70 covers the border covering region 402 is less than ½ of a total length of the four straight sides. Also in this embodiment, the PN junction structure 40 is rectangular in shape, which is beneficial for the arrangement of a plurality of chip within a single encapsulation.

Figure 7:
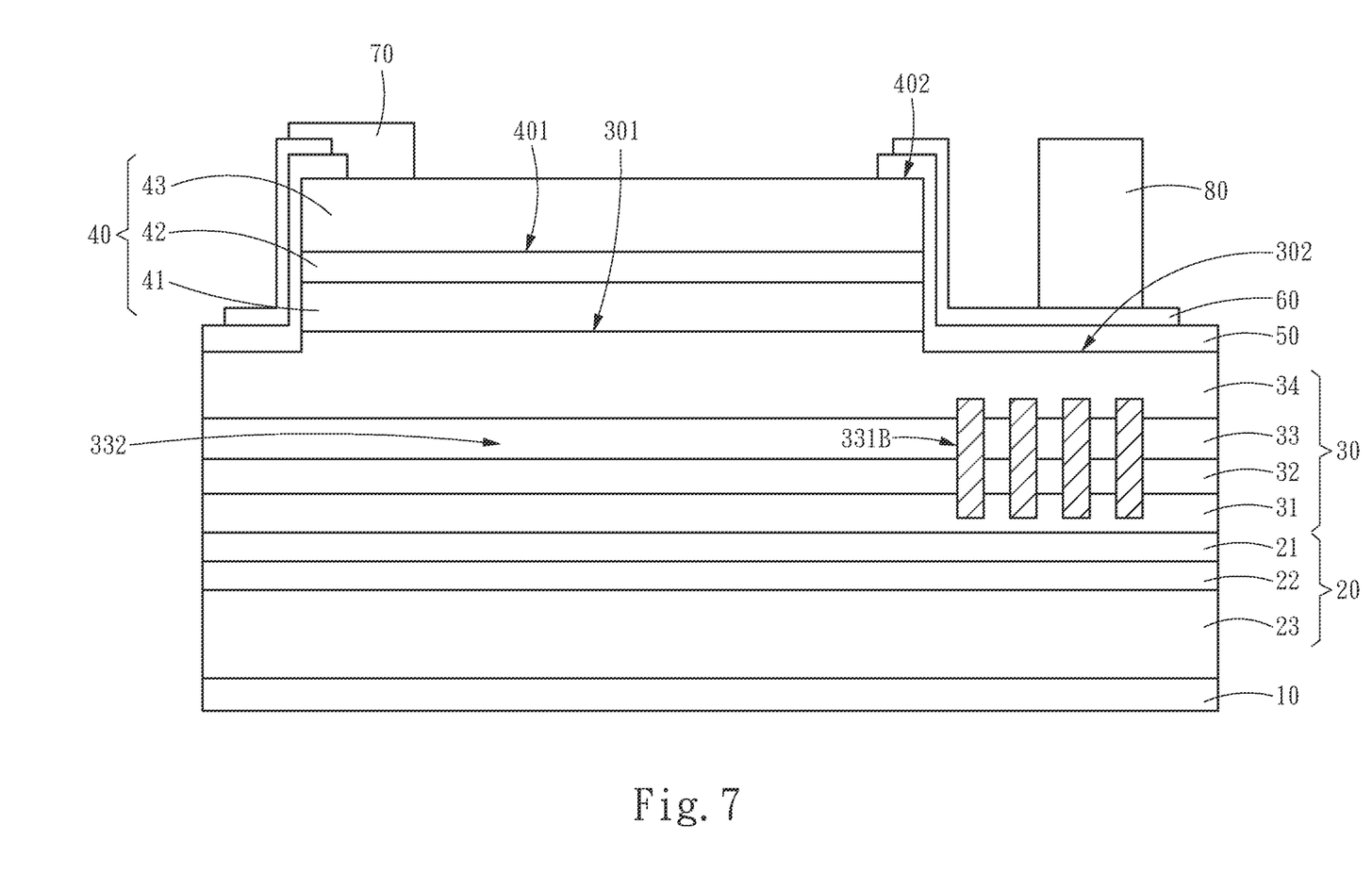
FIG. 7 is a cross-sectional side view of a chip structure according to a fourth embodiment of the invention.

Referring to FIG. 7, it is a cross-sectional side view of a chip structure according to a fourth embodiment of the invention, in which a P-type ohmic contact area 331B is further extended vertically to the highly conductive metal layer 31 and the high-concentration P-type semiconductor layer 34 to increase conductivity.

Figure 8:
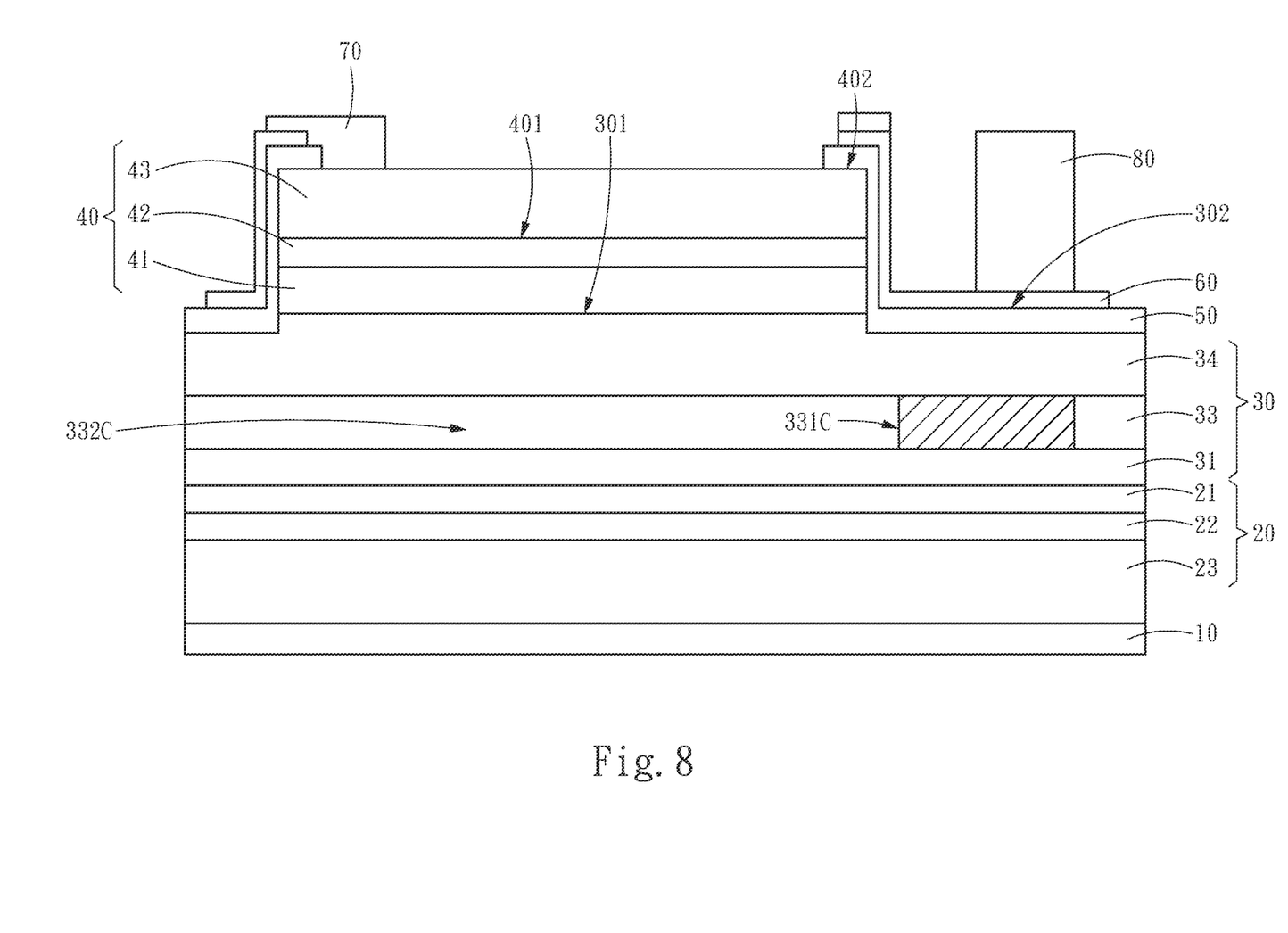
FIG. 8 is a cross-sectional side view of a chip structure according to a fifth embodiment of the invention.

Referring to FIG. 8, it is a cross-sectional side view of a chip structure according to a fifth embodiment of the invention, in which the interface structure 30 comprises the highly conductive metal layer 31, the partial P-type ohmic contact layer 33 and the high-concentration P-type semiconductor layer 34 stacked in sequence. A P-type ohmic contact area 331C is arranged in the partial P-type ohmic contact layer 33, and the partial P-type ohmic contact layer 33 further includes a non-ohmic contact area 332C. The non-ohmic contact area 332C is adjacent to the P-type ohmic contact area 331C and acts as a highly reflective metal layer 32. The non-ohmic contact area 332C is made of a highly reflective metal material (such as, silver (Ag), aluminum (Al) or gold (Au)) and is in non-ohmic contact with a high concentration P-type semiconductor. In this embodiment, the highly reflective metal layer 32 is replaced with the non-ohmic contact area 332C made of the highly reflective metal material.

Figure 9:
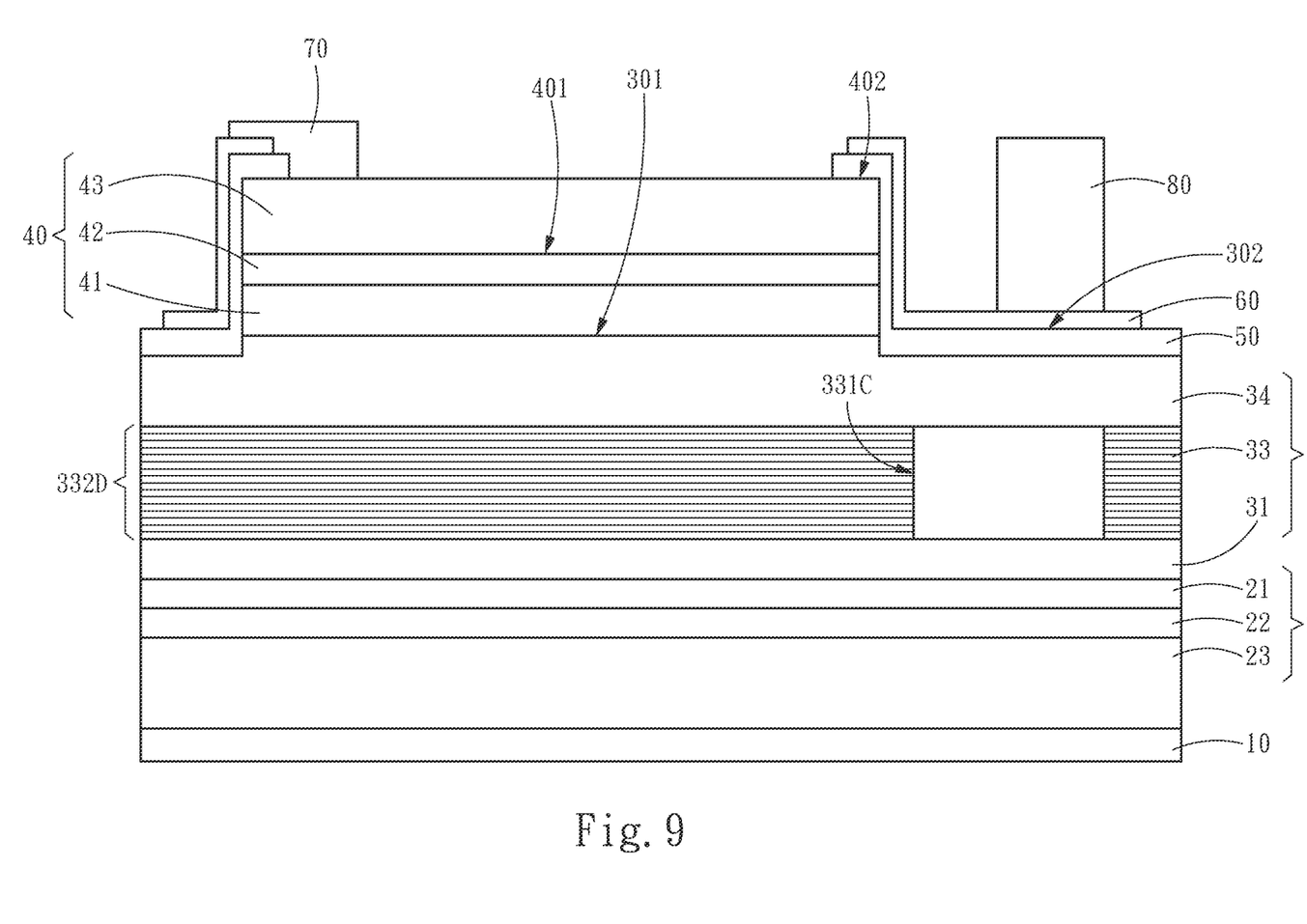
FIG. 9 is a cross-sectional side view of a chip structure according to a sixth embodiment of the invention.

Referring to FIG. 9, it is a cross-sectional side view of a chip structure according to a sixth embodiment of the invention. The interface structure 30 comprises the highly conductive metal layer 31, the partial P-type ohmic contact layer 33 and the high-concentration P-type semiconductor layer 34 stacked in sequence; and a P-type ohmic contact area 331C is provided in the partial P-type ohmic contact layer 33. In the embodiment, the partial P-type ohmic contact layer 33 further comprises a non-ohmic contact area 332D as a highly reflective metal layer 32. The non-ohmic contact area 332D is an omni-directional reflector (ODR), e.g., stacking multiple layers of SiO$_2$ or TiO$_2$.

In summary, the improvement of the invention comprises:

1. By conducting the current from the N-type ohmic contact electrode to the P-type ohmic contact area on the opposite side, the current introduced by the N-type ohmic contact electrode is allowed to flow obliquely downward through the central region of the active layer in the PN junction structure, so that an optimal upward light emitting is achieved since there is no shielding above the central region in the PN junction structure. Further, the downward light is reflected to the upper light-emitting surface by the non-light-absorbing reflecting surface, so that the demand for high energy efficiency is achieved.

2. The absence of the PN junction structure below the N-type electrode pad avoids defects in the PN junction structure due to the wire bonding stress of the packaging process. In addition, the heat generated by the N-type electrode pad due to contact resistance does not conduct down to the active layer as in the conventional structure, affecting the carrier recombination efficiency.

What is claimed is:

1. A small-sized vertical light emitting diode chip with high energy efficiency, comprising:
   a P-type electrode;
   a chip conductive base structure, wherein the P-type electrode is provided at a side of the chip conductive base structure;
   an interface structure, wherein the interface structure is provided at a side of the chip conductive base structure opposite to the P-type electrode; the interface structure comprises a highly conductive metal layer, a highly reflective metal layer, a partial P-type ohmic contact layer and a high-concentration P-type semiconductor layer stacked in sequence, the high-concentration P-type semiconductor layer is light-transmitting, and the interface structure comprises a light-emitting region platform and an outwardly extending platform adjacent to the light-emitting region platform; the partial P-type ohmic contact layer comprises a P-type ohmic contact area located under the outwardly extending platform and a non-ohmic contact area located under the light-emitting region platform, wherein the P-type ohmic contact area is in ohmic contact with the high-concentration P-type semiconductor layer, and the non-ohmic contact area is in non-ohmic contact with the high-concentration P-type semiconductor layer;
   a PN junction structure, wherein the PN junction structure comprises a P-type semiconductor, an active layer and an N-type semiconductor stacked in sequence; the P-type semiconductor is arranged on the light-emitting region platform; the PN junction structure is a closed pattern comprising four straight sides and comprises a central region, a ratio of a longest side to a shortest side of the PN junction structure is less than 3; a light-emitting surface area of the PN junction structure is less than 0.06 square millimeters ($mm^2$);
   an insulating layer, wherein the insulating layer is formed on the outwardly extending platform; the insulating layer extends to cover the four straight sides of the N-type semiconductor to form a border covering region surrounding the N-type semiconductor;
   a bridging connected metal layer, wherein the bridging connected metal layer is provided on the insulating layer and extends to the border covering region and the outwardly extending platform;
   an N-type ohmic contact electrode, wherein the N-type ohmic contact electrode reaches ohmic contact with the N-type semiconductor at a position opposite to the outwardly extending platform; the N-type ohmic contact electrode partially covers the border covering region; the N-type ohmic contact electrode extends to the border covering region and is electrically connected to the bridging connected metal layer; and
   an N-type electrode pad, wherein the N-type electrode pad is formed on the bridging connected metal layer at a location corresponding to the outwardly extending platform to electrically connect the outwardly extending platform.

2. The small-sized vertical light emitting diode chip according to claim 1, wherein a length of the N-type ohmic contact electrode covering the border covering region is less than ½ of a total length of the four straight sides.

3. The small-sized vertical light emitting diode chip according to claim 1, wherein a biggest thickness region of the N-type semiconductor is greater than 2.5 micrometers (µm).

4. The small-sized vertical light emitting diode chip according to claim 1, wherein the PN junction structure is any one selected from a light emitting diode structure with a single PN junction or a tunnel junction light emitting diode structure with two PN junctions.

5. The small-sized vertical light emitting diode chip according to claim 1, wherein the N-type ohmic contact electrode comprises at least one exposing opening extending to a boundary of the PN junction structure.

6. The small-sized vertical light emitting diode chip according to claim 1, wherein the N-type ohmic contact electrode comprises at least one extension electrode extending into the central region and being a non-continuous area.

7. The small-sized vertical light emitting diode chip according to claim 1, wherein the high-concentration P-type semiconductor layer is any one selected from P-type gallium phosphide (p-GaP) or P-type indium gallium phosphide (p-$Ga_{(x)}In_{(1-x)}P$); and a high-concentration doping thereof is any one selected from carbon (C) or magnesium (Mg).

8. The small-sized vertical light emitting diode chip according to claim 1, wherein the non-ohmic contact area is made of any one selected from a transparent and light-transmitting dielectric material and a highly reflective metal material.

9. The small-sized vertical light emitting diode chip according to claim 8, wherein when the non-ohmic contact area is selected from the transparent and light-transmitting dielectric material, the non-ohmic contact area is an Omni-directional reflector (ODR).

10. The small-sized vertical light emitting diode chip according to claim 1, wherein the P-type ohmic contact area is any one selected from a continuous monolithic single region and a plurality of non-continuous regions.

11. The small-sized vertical light emitting diode chip according to claim 1, wherein the P-type ohmic contact area extends vertically into the highly conductive metal layer and the high-concentration P-type semiconductor layer.

12. The small-sized vertical light emitting diode chip according to claim 1, wherein the high-concentration P-type semiconductor layer comprises a thickness of more than 1 micrometer (µm).

* * * * *